(12) United States Patent
Huber

(10) Patent No.: US 11,327,334 B2
(45) Date of Patent: May 10, 2022

(54) METHODS OF MANUFACTURING A STEREOSCOPIC DISPLAY SYSTEM

(71) Applicant: 3D Live, Inc., Los Angeles, CA (US)

(72) Inventor: Nathaniel Huber, Hollywood, CA (US)

(73) Assignee: 3D Live, Inc., Los Angeles, CA (US)

( * ) Notice: Subject to any disclaimer, the term of this patent is extended or adjusted under 35 U.S.C. 154(b) by 0 days.

(21) Appl. No.: 16/404,606

(22) Filed: May 6, 2019

(65) Prior Publication Data

US 2020/0124869 A1 Apr. 23, 2020

Related U.S. Application Data

(62) Division of application No. 15/254,179, filed on Sep. 1, 2016.

(51) Int. Cl.
*H04N 7/18* (2006.01)
*G02B 30/25* (2020.01)
(Continued)

(52) U.S. Cl.
CPC .......... *G02B 30/25* (2020.01); *H01L 25/0753* (2013.01); *H01L 27/15* (2013.01);
(Continued)

(58) Field of Classification Search
CPC ...................................................... G02B 30/25
(Continued)

(56) References Cited

U.S. PATENT DOCUMENTS 5,040,863 A    8/1991   Kawakami et al.
6,433,483 B1 *   8/2002   Michael ............ A44C 15/0015
                                                       315/200 A
(Continued)

FOREIGN PATENT DOCUMENTS

CN    101572286 A    11/2009
CN    102750881 A    10/2012
(Continued)

OTHER PUBLICATIONS

Wei-Kee et al., "The activation of directional stem cell motility by green light-emitting diode irradiation," Elevier Biomaterials 34 (2013) 1911-1920.
(Continued)

*Primary Examiner* — Leron Beck
(74) *Attorney, Agent, or Firm* — Fish IP Law, LLP

(57) ABSTRACT

The present invention provides apparatus, systems, and methods for A stereoscopic display system including an array of Light Emitting Diodes (LEDs) is provided. The system includes a plurality of left LEDs, each left LED comprising a left housing, a left light transmitter arrangement within the left housing, and a left polarizing element positioned with the left housing above the left light transmitter arrangement and a plurality of right LEDs, each right LED comprising a right housing, a right light transmitter arrangement within the right housing, and a right polarizing element positioned with the right housing and above the right light transmitter arrangement. At least one left housing and left polarizing element pair are each irregularly formed and fit together, and at least one right housing and right polarizing element are each irregularly formed in a manner complementary to the at least one left housing and left polarizing element.

17 Claims, 20 Drawing Sheets

(51) Int. Cl.

| | | |
|---|---|---|
| *H04N 13/332* | (2018.01) | |
| *H04N 13/337* | (2018.01) | |
| *H01L 25/075* | (2006.01) | |
| *H01L 27/15* | (2006.01) | |
| *H01L 33/48* | (2010.01) | |
| *H01L 33/50* | (2010.01) | |
| *H01L 33/62* | (2010.01) | |
| *H01L 33/64* | (2010.01) | |
| *H01L 33/44* | (2010.01) | |

(52) U.S. Cl.
CPC .......... *H01L 33/486* (2013.01); *H01L 33/502* (2013.01); *H01L 33/62* (2013.01); *H04N 13/332* (2018.05); *H04N 13/337* (2018.05); *H01L 33/44* (2013.01); *H01L 33/644* (2013.01); *H04N 2213/001* (2013.01)

(58) Field of Classification Search
USPC .......................................................... 359/465
See application file for complete search history.

(56) References Cited

U.S. PATENT DOCUMENTS

| | | | |
|---|---|---|---|
| 8,542,270 B2 | 9/2013 | Nelson | |
| 2005/0052863 A1* | 3/2005 | Kim | G09F 9/33 362/232 |
| 2006/0054904 A1* | 3/2006 | Lin | H01L 25/0753 257/88 |
| 2006/0091412 A1 | 5/2006 | Wheatley et al. | |
| 2008/0225143 A1* | 9/2008 | Jotter | G09F 9/3026 348/280 |
| 2009/0129057 A1* | 5/2009 | Gietl | G09F 9/35 362/97.2 |
| 2009/0135183 A1* | 5/2009 | Sato | G01B 11/002 345/426 |
| 2010/0219251 A1* | 9/2010 | Decoux | G07D 7/12 235/470 |
| 2010/0231701 A1* | 9/2010 | Nelson | G02B 30/25 348/58 |
| 2011/0031513 A1 | 2/2011 | Hsieh et al. | |
| 2011/0182151 A1* | 7/2011 | Geyer | G04G 17/083 368/11 |
| 2012/0099193 A1* | 4/2012 | Yang | G02B 30/34 359/463 |
| 2012/0182495 A1* | 7/2012 | Yokogawa | H01L 25/0753 349/61 |
| 2015/0301253 A1* | 10/2015 | Henry | C09D 4/06 351/49 |
| 2016/0076748 A1* | 3/2016 | Sievers | H05B 45/00 362/231 |

FOREIGN PATENT DOCUMENTS

| | | |
|---|---|---|
| CN | 203552626 U | 4/2014 |
| CN | 104658439 A | 5/2015 |
| EP | 1605526 A2 | 12/2005 |
| EP | 1605526 A3 | 12/2005 |
| JP | 2123321 | 5/1990 |
| JP | 2004317815 A | 11/2004 |
| JP | 200734012 | 2/2007 |
| JP | 2014-183192 A | 9/2014 |
| WO | 2011060511 A1 | 5/2011 |
| WO | 2011124117 A1 | 10/2011 |

OTHER PUBLICATIONS

Extended European Search Report dated Apr. 23, 2020 in corresponding EP Application No. 17847271.8, 8 pages.
International Preliminary Report on Patentability dated Mar. 5, 2019 in International Application No. PCT/US2017/048714, 5 pages.

* cited by examiner

METHODS OF MANUFACTURING A STEREOSCOPIC DISPLAY SYSTEM

PRIORITY

This application is a divisional of pending U.S. Ser. No. 15/254,179, filed Sep. 1, 2016.

FIELD OF THE INVENTION

The present invention generally relates to three-dimensional (3D) stereoscopic display systems. More particularly, the invention relates to the application of polarizing film or lens materials to light emitting diodes (LEDs) both in manufacturing and/or final video display assembly.

BACKGROUND

Stereoscopic display systems attempt to recreate a real world visual experience wherein a viewer sees a different view or image in each eye. In a real world viewing experience, a viewer with two eyes sees two slightly different images, as each eye is spaced apart in a slightly different viewing position. A goal of stereoscopic video display systems is to present a separate and different view to each eye of the viewer.

Earlier attempts to recreate a real world visual 3D experience employed an apparatus similar to corrective eyewear comprised of one lens of one color and second lens of a second color. A monitor or projector projected two views on one screen, with each view being color coded so as to be complementary to one eyewear lens or the other. The use of color to segregate viewing channels would often lead to headaches for the viewers.

Recent 3D designs focus on creating a 3D viewing experience within a traditional movie theater environment, using devices centering around a display on a lenticular screen constructed of fabric. However, limited stereoscopic viewing advancements have occurred outside the movie theater environment, including on billboards and other public media/advertising delivery devices. In general, it would be desirable to provide a 3D viewing experience using a wider range of devices, billboards, LED movie theater screens, stadium jumbotrons, and/or other large display devices

SUMMARY OF THE INVENTION

According to one aspect of the present design, there is provided a stereoscopic display system, comprising an array of Light Emitting Diodes (LEDs) comprising a plurality of left LEDs, each left LED comprising a left cathode, a left anode, a left housing contacting the left anode and the left cathode, a plurality of left leads within the left housing, a left light transmitter arrangement within the left housing, and a left polarizing element positioned with the left housing above the left light transmitter arrangement, and a plurality of right LEDs, each right LED comprising a right cathode, a right anode, a right housing contacting the right anode and the right cathode, a plurality of right leads within the right housing, a right light transmitter arrangement within the right housing, and a right polarizing element positioned with the right housing and above the right light transmitter arrangement. At least one left housing and left polarizing element pair are each irregularly formed and fit together, and at least one right housing and right polarizing element are each irregularly formed in a manner complementary to the at least one left housing and left polarizing element.

According to another embodiment of the present design, there is provided a stereoscopic display system comprising an array of Light Emitting Diodes (LEDs) comprising a plurality of left LEDs, each left LED comprising a left housing, a left light transmitter arrangement within the left housing, and a left polarizing element positioned with the left housing above the left light transmitter arrangement and a plurality of right LEDs, each right LED comprising a right housing, a right light transmitter arrangement within the right housing, and a right polarizing element positioned with the right housing and above the right light transmitter arrangement. At least one left housing and left polarizing element pair are each irregularly formed and fit together, and at least one right housing and right polarizing element are each irregularly formed in a manner complementary to the at least one left housing and left polarizing element.

According to a further embodiment, an apparatus for placing Light Emitting Diodes (LEDs) in an arrangement is provided, comprising a carrier tape and a plurality of LEDs positioned on the carrier tape, each LED comprising a housing, a light transmitter arrangement within the housing, and a polarizing element positioned with the housing above the light transmitter arrangement. Each housing comprises a specific directional feature representing a polarization direction and each polarizing element includes a complementary specific directional feature configured to fit with one corresponding housing.

These and other advantages of the present invention will become apparent to those skilled in the art from the following detailed description of the invention and the accompanying drawings.

Various resources, features, aspects and advantages of the inventive subject matter will become more apparent from the following detailed description of preferred embodiments, along with the accompanying drawing figures in which like numerals represent like components.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

Figure 1:
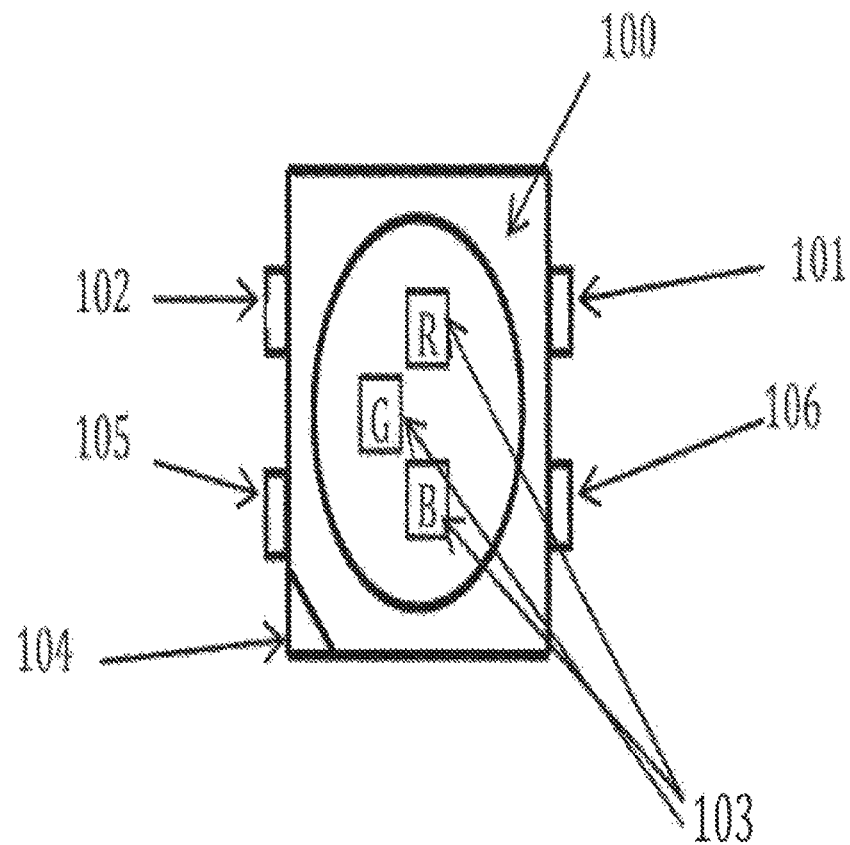
FIG. 1 is a front perspective view of a standard LED, specifically an RGB SMD LED, with one or more anode and cathode termination points.

FIG. 1 is a functional block diagram illustrating a distributed data processing environment.

The present design is useful in overcoming issues with previous designs by providing a configuration of circular, linear or otherwise polarized or light segregating light emitting diodes (right LEDs and left LEDs) in LED display systems. The design provides for modular use of polarized material or lenses uniquely fastened and registered atop or inside LED housings for displaying 3D image or video content.

It is to be understood that any type of LED may be employed in the current design. While the present description generally discusses Surface Mounted Device Light Emitting Diodes (SMD LEDs) using RGB (red, green, and blue) semiconductors, it is to be understood the invention is not so limited. Any type of LEDs or similar devices may be employed, including but not limited to RGBY, RGBW (white), RGB plus infrared, OLED, digital RGB, and quantum dot LEDs. In general, the present design relates to the polarizing of LEDs for stereoscopic viewing.

The design in one particular embodiment includes circular or linear polarized or otherwise polarized or light segregating left and right SMD LEDs arranged in specific patterns and mounted to a circuit board or substrate in alternating rows of right or left eye viewing SMD LEDs.

The use of complimentary linear or circular polarized material or lenses assembled as part of each individual right LED creates a right viewing channel through light exiting through one or more horizontal or diagonal row(s) of right LEDs while a left eye viewing channel is created on another horizontal or diagonal row(s) of left LEDs. The result is a satisfying 3D LED experience on a large or potentially very large device, such as an indoor or outdoor stadium screen or movie exhibiting theater.

Additionally, the use of a specially selected diffuser for diffusing luminance of light emanated from the LED's semiconductors enhances the three-dimensional effect in two ways. First, the point light source nature of the individual LED semi-conductors tends to "blow thru" polarization material causing a ghosting effect that may not be optimal for viewing.

The addition of a rear diffusion filter spreads out the light, creating a reduced lumens-per-square-millimeter value that enhances the polarization effect. Second, a rear diffusion filter also reduces the point of light from the source-effectively smoothing the overall appearance of the display, thus making it possible to view the content on the display at a closer distance without apparent pixilation.

In some embodiments, a diffuser is constructed using a diffusion film. This "diffuser" is not required but a possible addition should additional light cancellation be needed for a better 3D viewing experience.

Additionally, the application of a specially selected diffuser (e.g. a front diffusion screen) functions as an anti-glare surface helping to reject ambient outdoor or room light from the glossy surface of the polarizing material. Such a front diffusion material serves for reducing glare from light emanated from light sources external to the display assembly, and has the effect to smooth the overall appearance of the display, thus making it possible to view the content on the display at a closer distance without apparent pixilation.

The applications for this design are therefore numerous and enable realistic 3D viewing at both outdoor and indoor events such as theaters, movie theaters, concerts, and sporting events or anywhere viewers have appropriate eyewear available for 3D viewing. The embodiments are configured to facilitate permanent 3D LED tile or panel manufacturing. The LEDs when combined into a large display can be used as a standard 2D LED display by providing 2D video or image content, or the display can show 3D content when playing corresponding stereoscopic 3D video or still images with the appropriate eyewear. Very large display areas may beneficially use the teachings herein to provide stereoscopic content.

In general, the present design includes large format three dimensional (3D) stereoscopic display systems using light emitting diodes (LEDs) to display 3D image and video content. These large format LED display systems include LEDs arranged so that each LED represents a pixel. This design provides two different "polarized LEDs" (left LED and right LED) such that the system utilizes two different left and right polarized LEDs instead of a single unpolarized LED.

One particular difference between the two LEDs is the precise registered rotation of a polarized material or polarized lens affixed atop or inside the LED housing. Each LED housing may include a custom shaped piece of polarized material or polarized lens with a precise registered rotation matched to the lenses in at least one of the lenses in a pair of 3D glasses worn by a viewer.

The design also includes assembling pairs of polarized LEDs (left LEDs and right LEDs) on a circuit board substrate (LED module or tile). The pattern of the polarized LEDs assembled on the substrate LED tile or module typically includes alternating the two different types of SMD LEDs (right LEDs and left LEDs) in a given direction, e.g. horizontally.

The combination of the precise orientation of the right LEDs and left LEDs assembled in an alternating pattern in a series of one LED module or multiple LED modules, in conjunction with matched 3D glasses and the presentation of stereoscopic video or images on the display in a corresponding stereoscopic video format results in a 3D stereoscopic viewing experience. The corresponding 3D video format matches one or more left eye video pixel(s) with left LEDs mounted on the circuit board/substrate and one or more right eye video pixels with right LEDs mounted on the circuit board/substrate. This stereoscopic video format matches the pattern in which the left and right LEDs are mounted to the LED tile(s) or module(s) (circuit board/substrate).

The LED display disclosed can also present a 2D viewing experience by displaying 2D video or images on the same polarized LEDs arranged in an alternating pattern. The viewer may view 2D images without corresponding or matched 3D eyewear. According to the present design, the video feed is a two-dimensional video feed with stereo linear or checkerboard pattern of 3D video. In order to view 2D images, there is no change of either the hardware disclosed or the eyewear worn by a user. The difference between 2D and 3D is that the single video feed is not encoded with a 3D video pattern in the single feed when 2D transmission is desired. In either situation, the eyewear provides a satisfactory image to a viewer.

The two types of polarized LEDs are referred to herein as right LEDs and left LEDs. When assembling the LED display modules with a Pick and Place (PNP) machine, the pattern of the mounted SMD LED (surface mounted device light-emitting diode) chips may be in a checkerboard pattern comprised of alternating diagonal rows of right LEDs and left LEDs.

In this arrangement, the LEDs begin with (1) a left LED, followed by (2) a right LED, (3) left LED, (4) right LED, (5) left LED, (6) right LED, and so on. The next row of LEDs alternates, beginning with (1) a right LED, followed by (2) a left LED, (3) right LED, and so on. The LED display can also have a different pattern of alternating horizontal rows comprised of right LEDs and rows of left LEDs.

A PNP machine is the most common device used for assembling LEDs on an LED display module. The PNP machine receives SMD LED chips via carrier tape and reel. The PNP machine receives one or more reels of right LEDs and one or more reels of left LEDs. The PNP machine alternates sourcing the LEDs from right LED reel to left LED reel when placing or assembling the LEDs to achieve the alternating "checkerboard pattern" of right I left I right I left discussed above. Alternately, the PNP machine may receive LEDs from a single reel or multiple reels holding left LEDs and right LEDs alternating in sequence—right, left, right, etc. In this case the PNP machine is programmed to place the alternating LEDs from a single tape and reel to the specified alternating polarized LED pattern location to match the alternating diagonal row pattern (checkerboard pattern) or desired horizontal row pattern.

For better light cancellation a diffuser material can be layered beneath the polarizer material or lens. The diffuser may help expand the throw of the light generated from the diode and increase the light cancellation effectiveness of the polarized material or lens. The 3D SMD LEDs may also include a front diffuser to reduce glare from external light sources and improve viewing, Various methods for manufacture and assembly of the right and left LEDs with polarizing material and/or lenses are also provided, including a method for the application of individual polarized LEDs to LED modules. Also included are various embodiments of eyewear used in viewing the 3D image, the eyewear including a left eye lens and a right eye lens that polarize light to create a left eye view and a right eye view.

FIG. 1 is a front perspective view of a standard RGB SMD LED with one or more anode and cathode termination points. The number of termination points of the SMD LED are not material to the present design; any appropriate RGB SMD LED may be employed, where different LEDs may include one anode, one cathode, one data contact point, and one ground contact point. The total number of termination points may vary.

Figure 10:
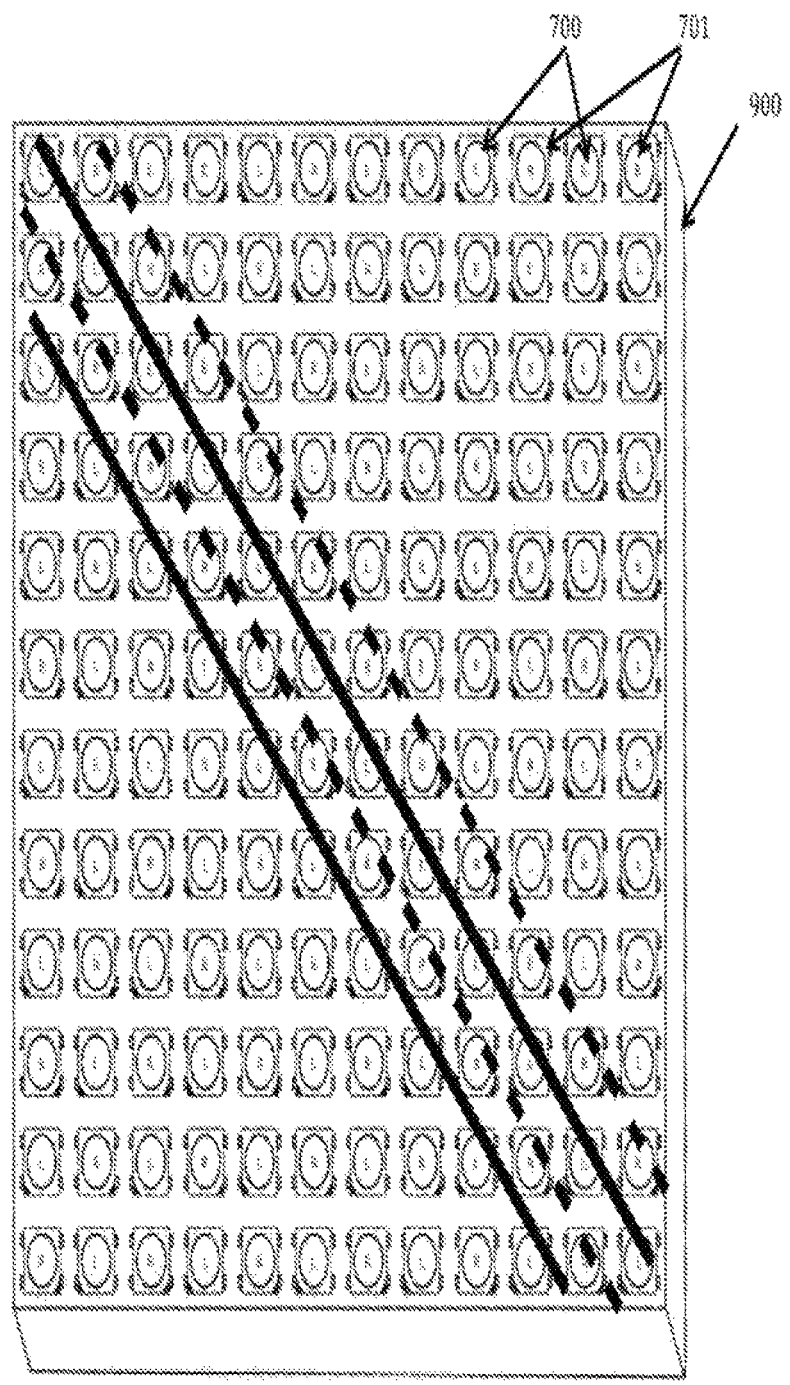
FIG. 10 is a top or front perspective of an LED tile or module with an assembled checkerboard pattern of both right and left SMD LEDs.
Figure 11:
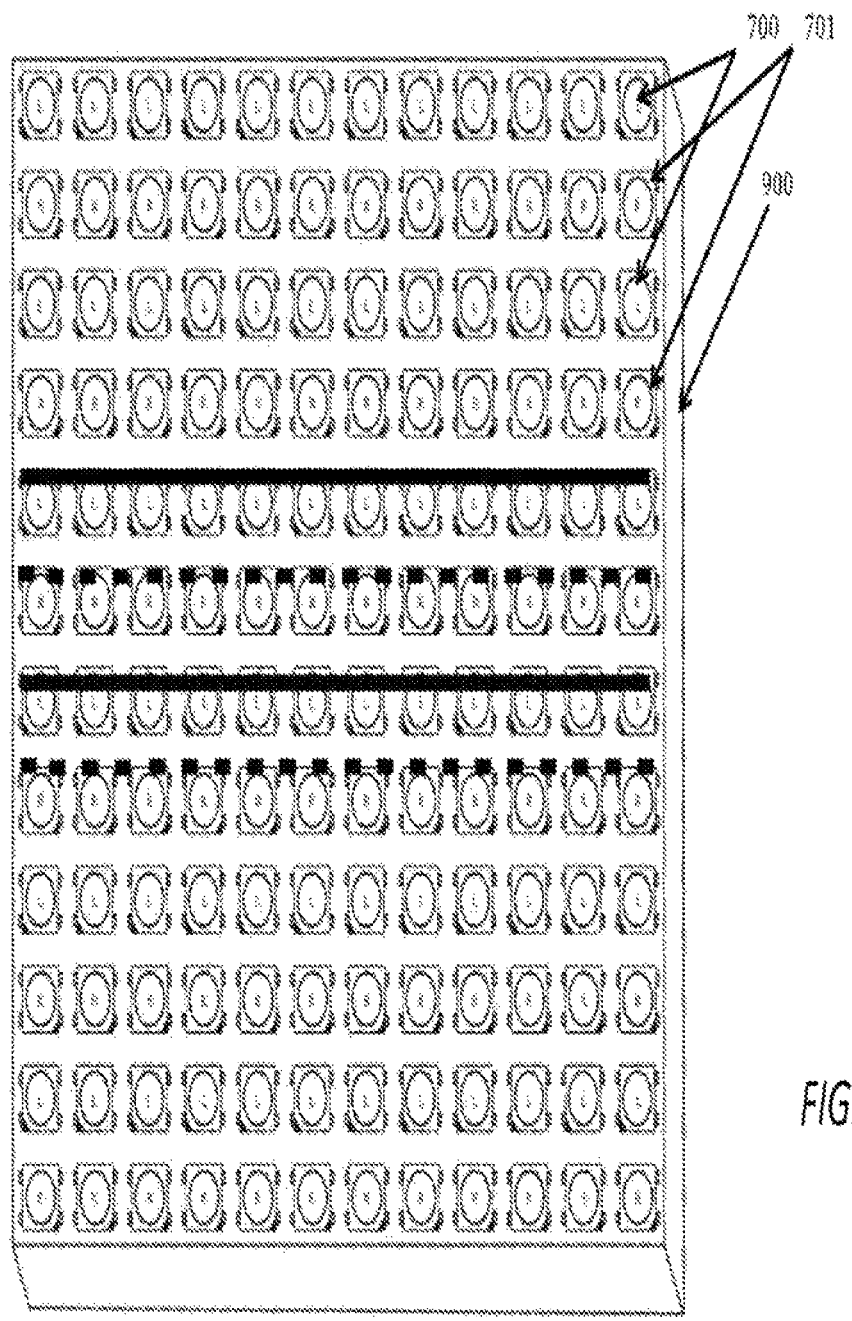
FIG. 11 is a top or front perspective of a LED tile or module with an alternate linear pattern of right and left SMD LEDs.

FIG. 1 illustrates a single SMD LED chip. Multiple SMD LED chips assembled on a substrate 900 form a display that is modified to create a 3D LED display as seen in FIGS. 10 and 11. The display may be any one of a number of forms known in the industry such as an LED display, LED video wall, LED screen, and so forth. Polarizing material or a lens is applied to a top surface of the SMD LED housing 100 (shown in FIGS. 1-6) of each individual SMD LED on one or more LED tiles or modules 900. Use of such a polarized SMD LED with software encoding image data for display provides stereoscopic imaging.

With respect to use of LEDs generally in stereoscopic image projection, Applicant references the design presented in U.S. Pat. No. 8,542,270 the entirety of which is incorporated herein by reference. Two-dimensional image display may also be provided by the current design.

FIG. 1 is a front or top view of an LED, specifically an SMD LED chip, and shows various components combining to form an SMD LED chip. FIG. 1 shows the material body or "housing" 100 of the LED and the registration key or slot 104 used for aligning and holding the polarizer material or lens in a correct or proper rotation and orientation. FIG. 1 also includes semiconductors 103 (Red, Green, and Blue semiconductors in this case) that are the light emitting elements in this example of a SMD LED. Anode 102 and cathode 101 are presented in addition to data information input 105 and the ground termination 106. Elements 101, 102, 105, and 106 can be provided in any variation or orientation. Anode 102, cathode 101, data information input 105, and ground termination 106 are also the solder points for mounting the SMD LED chip to the substrate or circuit board.

Figure 2:
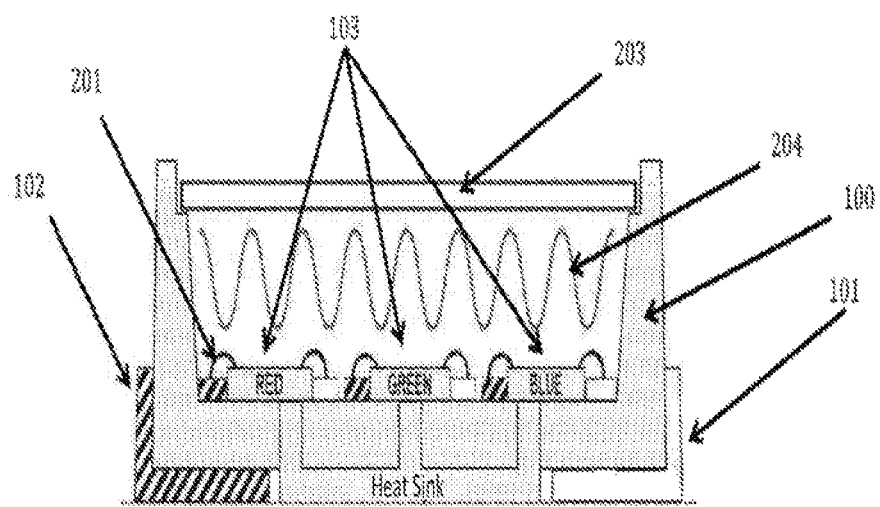
FIG. 2 is a cross sectional view of an RGB SMD LED with polarizing material or lens or other light segregating material layered above the RGB semiconductors.

FIG. 2 is a cross sectional view of an LED, specifically an RGB SMD LED, having polarizing material, or a lens, or other light segregating material 203 layered above the RGB semiconductors 103. The polarizer material or lens may be affixed in place using an adhesive or resin 204, preferably as transparent an adhesive or resin as possible, or alternately provided at an exterior edge so as to minimally obscure the RGB semiconductors beneath.

FIG. 2 also details other SMD LED elements such as the heat resistant polymer LED housing 100 and anode 101 and cathode 102 soldering terminations. This image also shows the leads 201 attaching the semiconductors 103 to their source of power (anode 101 and cathode 102). Leads, cathodes, and anodes may or may not be employed in certain instances. Current may be introduced in varying ways. Also shown in this view is a heat sink at the base of the device. Orientation, components employed, and/or number of the semiconductors may vary. SMD LEDs used in a video display may include three semiconductors, commonly Red (R), Green (G), and Blue (B) light emitters.

Figure 3:
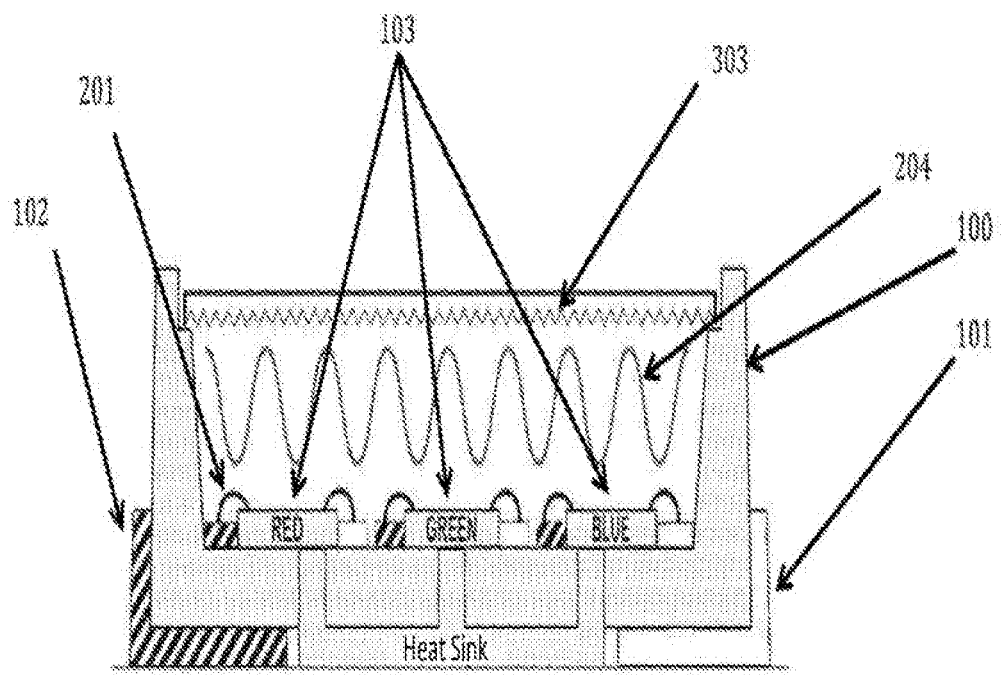
FIG. 3 is a cross sectional view of an RGB SMD LED with lightly sanded polarizing material or lens or other light segregating material layered above the RGB semiconductors.

FIG. 3 is a cross sectional view of an RGB SMD LED including a lightly sanded polarizing material, or lens, or other light segregating material layered above the RGB semiconductors. The polarizer material or lens 303 is sanded or lightly abraded to ensure a better bond with the adhesive or resin 204. As with FIG. 2, the depiction of FIG. 3 shows RGB semiconductors 103, as well as other SMD LED elements such as the heat resistant polymer LED housing 100 and anode 101 and cathode 102 soldering terminations, leads 201 attaching the semiconductors 103 to their source of power (anode 101 and cathode 102), and a heat sink at the base of the device. Orientation, components employed, and/or number of the semiconductors may vary.

Figure 4:
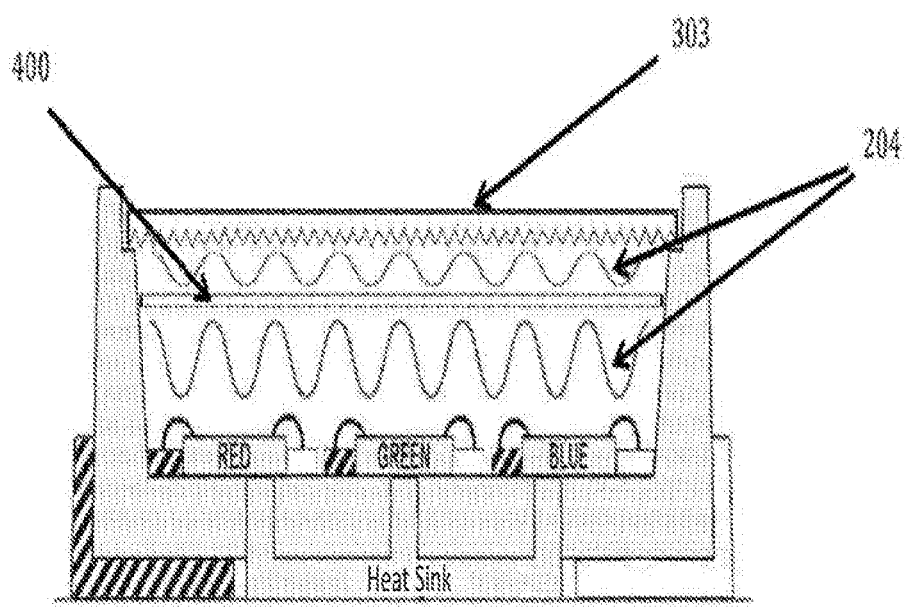
FIG. 4 is a cross sectional view of RGB SMD LED with lightly sanded polarizing material or lens or other light segregating material layered above the RGB semiconductors, including an added layer of diffuser material between the polarizing material and the RGB semiconductors.

FIG. 4 is a cross sectional view of an RGB SMD LED with lightly sanded polarizing material or lens or other light segregating material layered above the RGB semiconductors. This image also includes an added layer of diffuser material 400 between the polarizing material 303 and the RGB semiconductors. Adhesive, resin, glue, or epoxy resin may be provided both between the RGB semiconductors and the diffuser material 400, as well as between the diffuser 400 and the polarizer material or lens 303 to ensure both the diffuser and polarizer are secured to the heat resistant polymer LED housing. Again, the adhesive, resin, glue, or epoxy resin is preferably as transparent as possible, and such bonding materials or other reasonable bonding materials known in the art may be employed. Alternately, an amount of bonding material may be applied at edges of the components shown, such as edges of the polarizer material or lens 303 and/or diffuser 400 to reduce risk of obscuring or impeding transmission from the RGB semiconductors. Components in the device of FIG. 4 are generally similar to those of FIGS. 2 and 3 with the exception of those components specifically mentioned.

Figure 5:
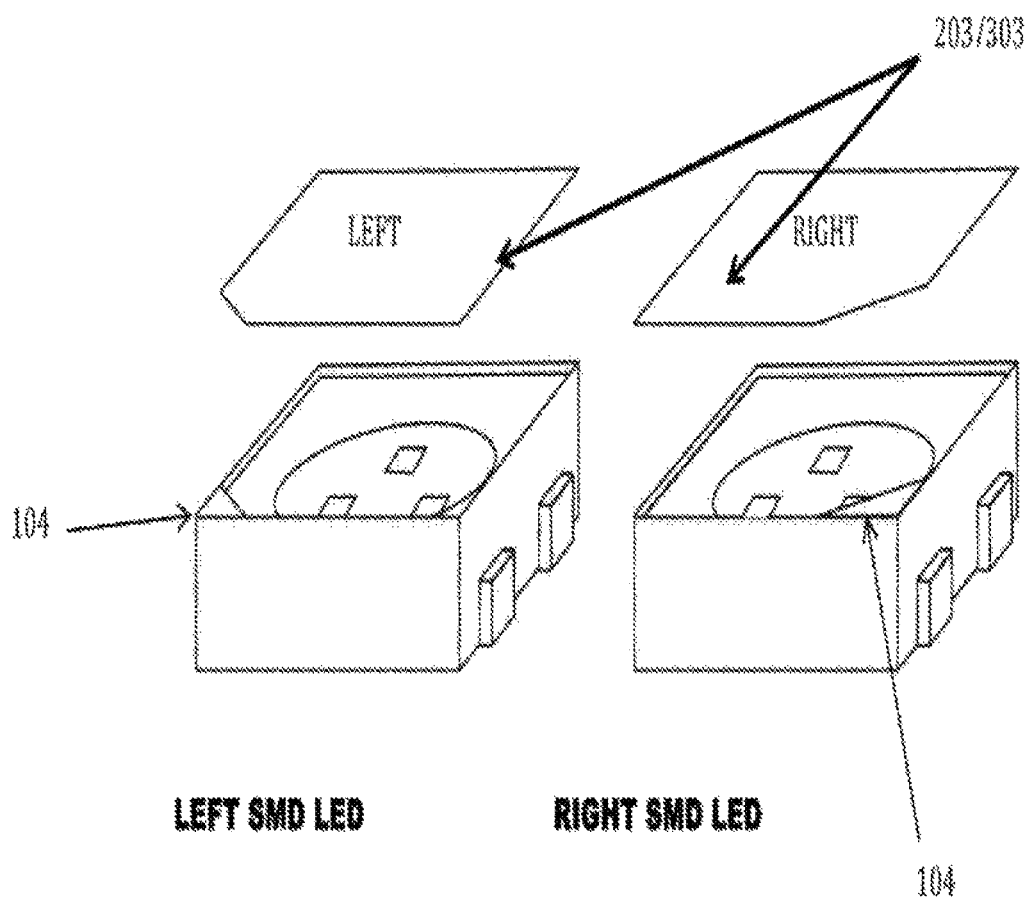
FIG. 5 is a perspective view of both right and left SMD LEDs with the polarizing material and corresponding key marks or slots for registration of the polarizing lens or material.

FIG. 5 is a perspective view of both right and left SMD LEDs with the polarizing material and the corresponding key marks or slot for registration of the polarizing lens or material. FIG. 5 shows how the LED housing of the left and right SMD LEDs have a corresponding cut-out or key mark or slots that hold the polarizer in a registered orientation.

These alignment hardware keys or slots are part of the heat resistant polymer housing 104 and the keys match the key mark or slot on the polarizing material or lens 203/303. The key or slot marks assure the correct rotation and alignment of the polarizing material and also serve as a visual key to know which polarizer has been applied after the lens is in fastened in place. The left polarizer is prepared for mounting by having at least one slot or key 104 cut into its lower edge, said slot matching the one that is part of the left LED housing.

The right polarizer is prepared for mounting by having at least one slot or key 104 cut into its lower edge, the slot matching the piece or part formed on a corner of the left LED housing. Different orientations and slot or key shapes or sizes may be employed, but it is beneficial to differentiate between left and right. The number, size, and placement of the keys of the LED housing correspond to the characteristics of the notches found in the bottom edge(s) of the polarizer material or lens so that the lens fits with the LED housing. The left polarizer is also prepared for mounting by having at least one slot or key 104 cut into its lower edge in this embodiment, the slot also matching the corresponding part of the left LED housing.

Features such as keys, slots, etc. provide a visual reference enabling a person or a machine to recognize left and right components for arrangement and/or assembly on the tile or module. The orientation of the feature can be used to identify right LEDs and left LEDs and whether the LED is oriented properly when placed on a tile or module.

Figure 6:
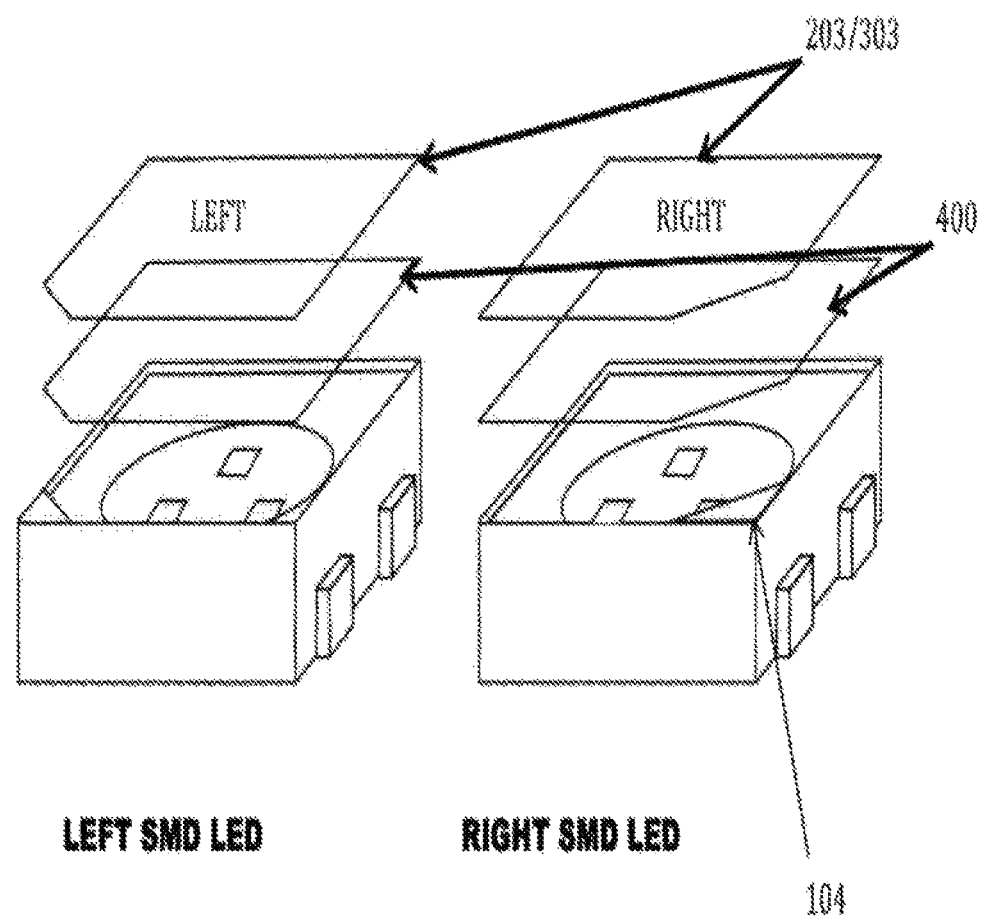
FIG. 6 is a perspective view of both right and left SMD LEDs with the polarizing material and corresponding key marks or slots for registration of the polarizing lens or material, including a corresponding cut-out, key mark, or slot holding the polarizer in a registered orientation, and including diffuser material in a particular orientation.

FIG. 6 is a perspective view of both right and left SMD LEDs with polarizing material and corresponding key marks or slots for registration of the polarizing lens or material. FIG. 6 shows the LED housing of the left and right SMDs with a corresponding cut-out, key mark, or slot that holds the polarizer in a registered orientation. FIG. 6 shows diffuser material inserted between the semiconductors and the polarizing material or lens. FIG. 6 shows an alignment method similar to that presented in FIG. 5 but with the addition of the diffuser material 400 to the assembly. FIG. 6 shows that the diffuser material 400 is situated between the semiconductors of the LED and the polarizing material 203/303 such that the diffuser material 400 is the front facing material on the LED chip.

Figure 7:
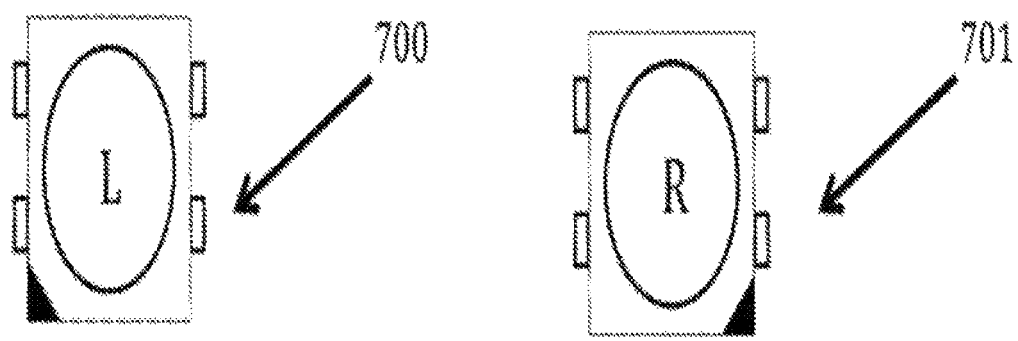
FIG. 7 is a top view of finished or completed left and right polarized SMD LED chips for orientation and final assembly pattern reference as shown in FIGS. 8-11.
Figure 8:
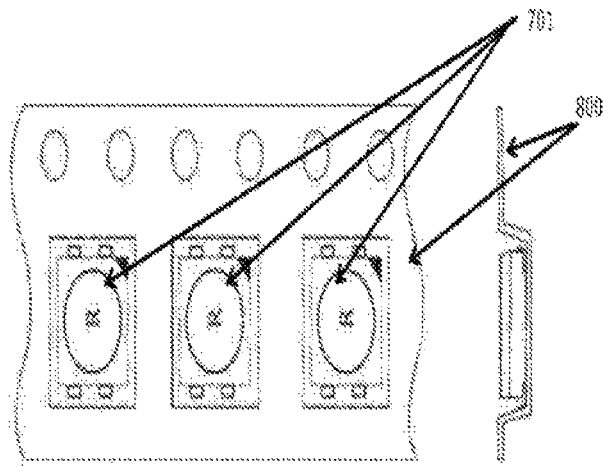
FIG. 8 illustrates a top view of a particular arrangement of the items presented in FIG. 7, including left and right polarized LEDs properly situated and oriented each in their own carrier tape for use with a PNP machine.
Figure 8:
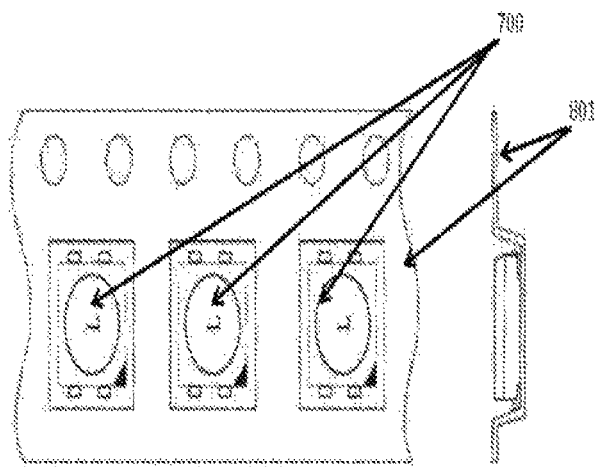
Figure 9:
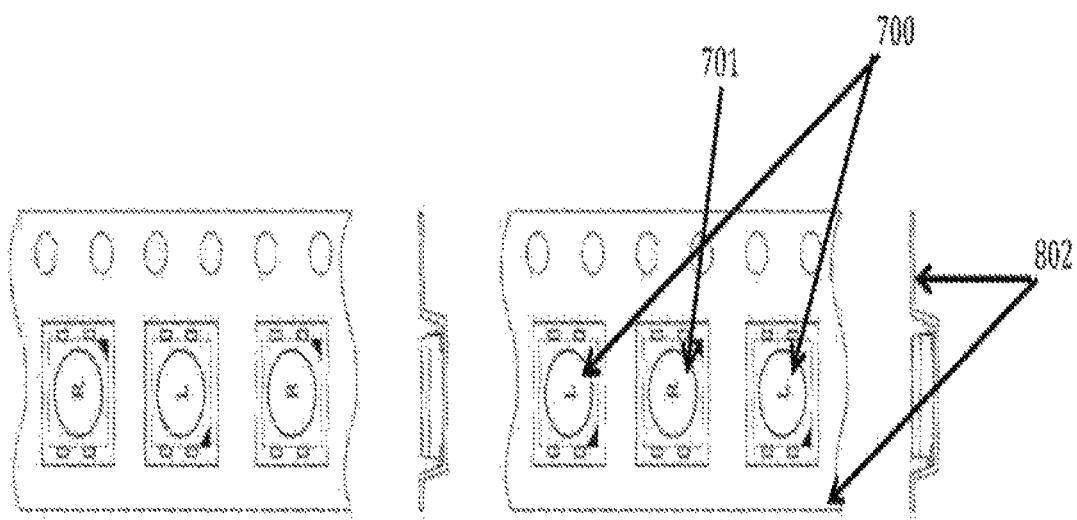
FIG. 9 is a top view of a particular arrangement of the items presented in FIG. 7 showing LEDs properly situated and oriented in a single carrier tape, including alternating left/right LEDs for use in a PNP machine.

FIG. 7 is a top view of finished or completed LED chips, namely left and right polarized SMD LED chips, for orientation and final assembly pattern for use in the manner shown in FIGS. 8-11. Different cut outs, key marks, or slots are provided for the two SMD LEDs. FIG. 8 illustrates a top view of the representations of FIG. 7, with left and right polarized LEDs situated and oriented in respective carrier tapes for use in a PNP machine that utilizes two or more reels to assemble LED tiles or modules. FIG. 9 is a top view of the representations of FIG. 7, with left and right polarized LEDs situated and oriented on a single carrier tape.

Each carrier tape holds alternating left and right LEDs for use in a PNP machine that employs one or more reels to assemble LED tiles or modules. The orientation of the LEDs is correct within the carrier tapes shown and as a result a PNP machine does not need to evaluate orientation. If any carrier tape can be used, such a machine would need to be furnished with orientation evaluation functionality. In other words, the orientation for the LED is either known to the machine or, if not known, must be determined using orientation functionality (machine viewing and determination, human viewing, etc.)

FIG. 8 shows left and right SMD LEDs prepared for delivery to a pick and place machine for final assembly of a 3D LED tile or module. The design provides right and left polarized LEDs (701, 700) via carrier tape and reel 800, 801. In the two examples of FIG. 8, separate carrier tapes each holding one or more right/left polarized SMD LED(s) are shown. The first representation shows right LED(s) 701 in carrier tape 800. The second details a separate carrier tape 801 that holds Left LED(s) 700.

FIG. 9 is an alternate type of carrier tape 802 populated with alternating left 700 and right 701 polarized SMD LEDs. Using this arrangement, two separate reels are not necessary to feed a PNP machine. A single reel can be used to feed the PNP machine, with the carrier tape arrangement or PNP machine including functionality to determine the orientation of the LED, i.e. left or right.

FIG. 10 is a top view of an assembled 3D LED tile or module 900 having right and left SMD LEDs 701, 700 for 3D viewing. In this arrangement, right and left SMD LEDs 701, 700 are oriented in a checkerboard pattern, with the solid diagonal lines covering or touching left SMD LEDs 700 and broken diagonal lines covering or touching right SMD LEDs 701.

Dimensions are not to scale, and SMD LEDs may be closer or further apart than they appear in these Figures.

FIG. 11 is a top view of an assembled 3D LED tile or module 900 having right and left SMD LEDs 701, 700 for 3D viewing. In this arrangement, right and left SMD LEDs 701, 700 are oriented in a linear pattern, with the solid horizontal lines covering or touching left SMD LEDs 700 and broken horizontal lines covering or touching right SMD LEDs 701. Dimensions are not to scale.

Thus according to the present design, there is provided an apparatus, or a method for creating an apparatus, comprising manufacturing and arranging two different types of circular, linear, or otherwise polarized or light segregating surface mount device light emitting diodes (left and right polarized SMD LEDs). When a plurality of both right and left SMD LEDs are assembled in alternating patterns on a subset of circuit board substrate(s) (LED module(s) or tile(s)) and stereoscopic encoded 3D video or image content is displayed through the plurality of left LEDs and right LEDs and viewed through polarized 3D eyewear, the result is a 3D stereo viewing experience. In the present design, a custom designed heat resistant polymer LED housing is shaped with a registration key mark or slot to hold a "left" custom shaped piece of polarized material or polarized lens above the leads, semiconductors, and micro lens of the LED at a specific rotation orientation. While a polymer is disclosed, other materials may be employed as long as they provide the benefits described herein.

Registration of the left polarized material or lens is designated by a key mark or slot unique to a left degree rotation of the left polarizer lens. A second custom designed heat resistant polymer LED housing is shaped with a registration key mark or slot to hold a "right" custom shaped piece of polarized material or polarized lens above the leads and semiconductors of the LED at a specific rotation orientation. Registration of the right polarized material or said lens is designated by a key mark or slot unique to a right degree rotation of the right polarizer lens.

The custom cut shape of the right polarized material or lens to include a corresponding key mark or slot matching the right LED housing registers the polarizing material to be mounted above the leads and semiconductors atop the heat resistant polymer LED housing. The right polarizer material or lens is typically fixed in place atop the (right) LED housing with a glue, silicone, or epoxy resin above the leads and semiconductors of the diode and beneath the polarizer material.

A second custom cut shape of left polarized material or lens with a corresponding key mark or slot matches the left LED housing that registers the polarizing material to be mounted above the leads, semiconductors, and micro lens atop the heat resistant polymer (left) LED housing. The left polarizer material or lens is fixed in place with a bonding material, such as glue, epoxy resin, or silicone. The left polarizer material or lens is provided above the leads and semiconductors of the diode and beneath the polarizer material.

The left and right polarizer material or lens may be lightly sanded or lightly abraded (as long as not damaging the polarization) on the bottom facing surface (semi-conductor facing side) for a better adhesion to the bonding material, i.e. glue or epoxy resin.

Once the glue, epoxy resin, or silicone is cured, the polarized SMD LEDs are arranged on a circuit board substrate or otherwise, i.e. an LED video display tile or module. The left LEDs and right LEDs may be arranged in a linear pattern in which the right LEDs are situated in a first set of alternating horizontal rows with the left LEDs in a second set of horizontal rows, the right/left rows alternating.

Alternately, the right and left LEDs may be arranged in a "checkerboard pattern" in which the right LEDs are situated in a first subset of alternating diagonal rows and the left LEDs in alternating diagonal rows (right diagonal/left diagonal/right diagonal etc.)

The design may also include a rear diffuser disposed between leads, semiconductors, and the custom cut shape of polarizing material in order to diffuse the luminance of light emanated from diodes (semiconductors) and reduce the concentration of light from a small to a larger area of the polarizing material, thus increasing the efficiency of the polarizing material to reduce the ghosting artifacts that interfere with the 3D effect.

A front diffuser may be provided, disposed in front of the custom cut shape of polarizing material, to reduce glare from light emanated from light sources outside the LEDs. The front diffuser also increases the viewing angle of the display by projecting a polarized image of an illuminated pixel onto the front surface on the front diffuser so as to be visible by a viewer at a wide angle.

Eyewear may be employed to view a resultant 3D image, the eyewear comprising a left and a right lens that polarizes light complementary to the right and left LEDs to create a left eye view and a right eye view from first and second projected views.

In one embodiment, the left and right polarized SMD LEDs generate circularly polarized light, where in another embodiment linearly polarized light is generated by the left and right polarized SMD LEDs.

The result of such a design is a display including a plurality of left and right light emitting diodes (right LEDs and left LEDs) used for displaying 3D image content. A plurality of left polarized LEDs form a first view of a 3D image while a plurality of right polarized LEDs form a second view of the 3D image.

In certain embodiments, at least one of the polarized LEDs may include a frosted surface. In another embodiment, at least one left polarized LED includes a directionally-facing key or slot and at least one right polarized LED comprises a directionally complementary-facing key or slot, such as the left LED including a left facing slot and the right LED a right-facing key or slot, or vice versa, or a top and bottom, in and out, etc.

In one embodiment, at least one left polarized LED comprises polarizing material for polarizing light in a first polarizing direction, and at least one right polarized LED comprises polarizing material for polarizing light in a second polarizing direction.

The design may include more than one left LED situated in a consistent rotational orientation in a carrier tape spooled on a single or multiple reels for use in a PNP machine. The specific rotation of the LEDs is employed in placing of the SMD LEDs on a LED display tile or module in an alternating horizontal pattern or diagonal pattern.

To maintain consistent rotational orientation of the left LED the LEDs are typically supplied to a PNP machine via carrier tape and reel. The carrier tape holds the LED's proper rotation based on the LED's rotation relative to guide holes of the carrier tape. A left LED is placed where a left LED is to be placed, and the same is true for a right LED.

Alternately, an alternating pattern of more than one right LED and left LED are provided in a carrier tape (right/left/right/left etc.) spooled on a single reel or multiple reels for PNP machine use. In either implementation, the carrier tape may have a unique guide or registration hole next to the carrier that corresponds with orientation of the LED, i.e. either a left LED or right LED. This registration hole or guide is recognizable to the PNP machine for proper programming and placement. The registration hole or guide will also define the rotational orientation of the LED in the carrier, recognizable to the PNP machine for programming and placement.

An alternate method for applying polarizer material or lenses includes applying a bonding material (glue, epoxy, resin, polymer, etc.), wherein any known means or method for affixing the polarizer material or lens can be used to ensure the lens is fixedly installed in or atop an SMD LED housing. Slits may be designed and manufactured to be located on the top section of the LED housing to align and hold a polarizer lens or material in place above the leads and semiconductors.

Matrix?

The design presented includes a two-dimensional array of LEDs forming tiles, modules, or panels. Complimentary linear or circular polarized material or lenses are assembled into the final LED tile/module/or panel, and multiple LED tiles or modules with polarized protective coverings may be combined to produce a large format 3D LED display.

The plurality of left and right polarizers are maintained in place on top of the assembled LEDs to form the fully assembled 3D LED video tile or module. Integration of polarizer lenses into the LED video tile's front facing plastic (or alloy) grid results in a 2D and 3D LED video display tile dictated by the video or image content displayed using the device. The front facing plastic or alloy grid is commonly a protective part of a completed LED video display tile or module. Each SMD LED of a tile or module is polarized using the polarizing filter affixed above the SMD LED housing by the plastic or alloy grid that serves as a protective cover.

The combination of the precise orientation of the right polarizer(s) and left polarizer(s) assembled in an alternating pattern in a series of one LED module or multiple LED modules results in a 3D stereoscopic viewing experience when used with matched 3D glasses when images in a corresponding stereoscopic video format are transmitted. The corresponding 3D video format matches one or more left eye video pixel(s) with left polarized LEDs and one or more right eye video pixel(s) with right polarized LEDs, with all LEDs mounted on the circuit board/substrate.

The plastic/alloy grid contains both left and right polarizers in a specific pattern of one or more right polarizers creating a right viewing channel through light exiting through one or more horizontal or diagonal row(s) of right polarizers while a left eye viewing channel is created on another horizontal or diagonal row(s) of left polarizers. The result is a satisfying 3D LED experience on a large or potentially very large device, such as an outdoor or stadium screen or movie exhibitor screen.

A metal or plastic grid is provided as a base for affixing the corresponding left and right polarizers above their corresponding SMD LED(s) mounted to the circuit board substrate. The grid also maintains polarizer rotational alignment with the respective SMD LEDs. The grid is typically held in place on the LED tile or module by using screws, clips or pins that attach to the same substrate as the SMD LEDs they protect and polarize.

Figure 12:
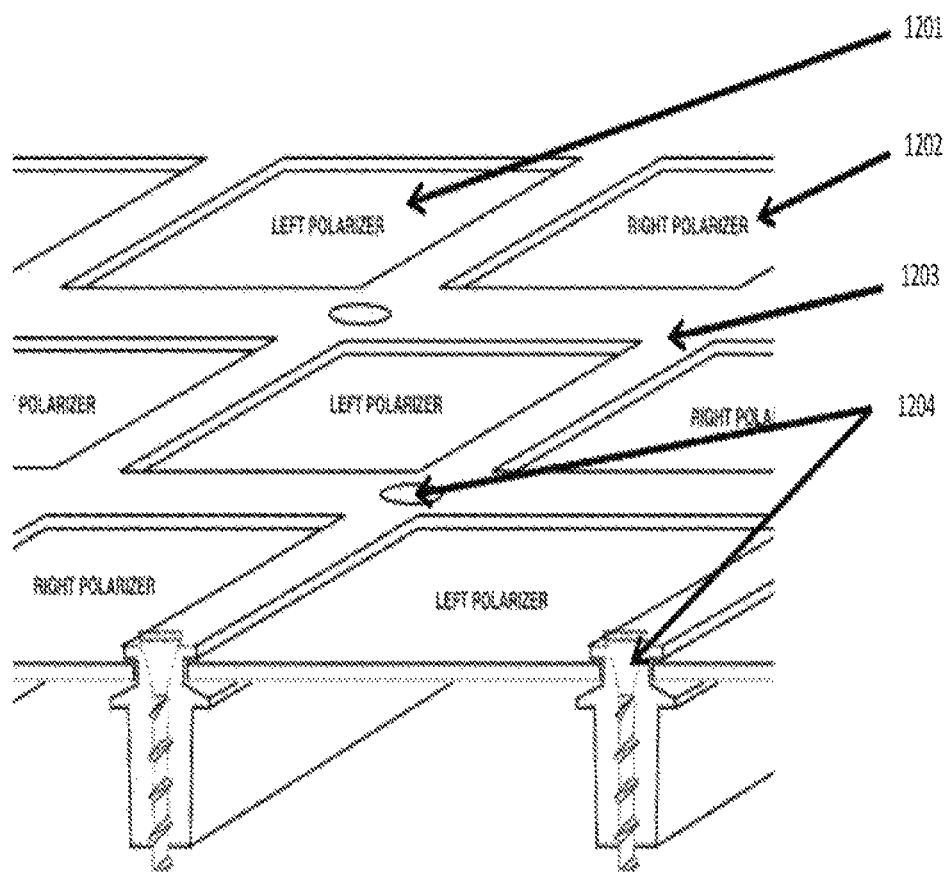
FIG. 12 shows an angled cross sectional view of the plastic or alloy front facing cover of a LED tile or module.

With respect to the grid, FIG. 12 shows an angled cross sectional view of the plastic or alloy front facing cover of a LED tile or module. FIG. 12 shows various elements making up the protective cover, including a plastic or alloy cover 1203 that contains left polarizer and filter 1201 and right polarizer and filter 1202. The plastic or alloy cover 1203 is held in place and affixed to the LED substrate using any reasonable means known in the art, such as screws, clips, or pins provided through screw holes such as hole 1204. A "checkerboard" pattern of the left and right polarizers and filters is provided in this particular arrangement inside the protective cover 1203.

Figure 13:
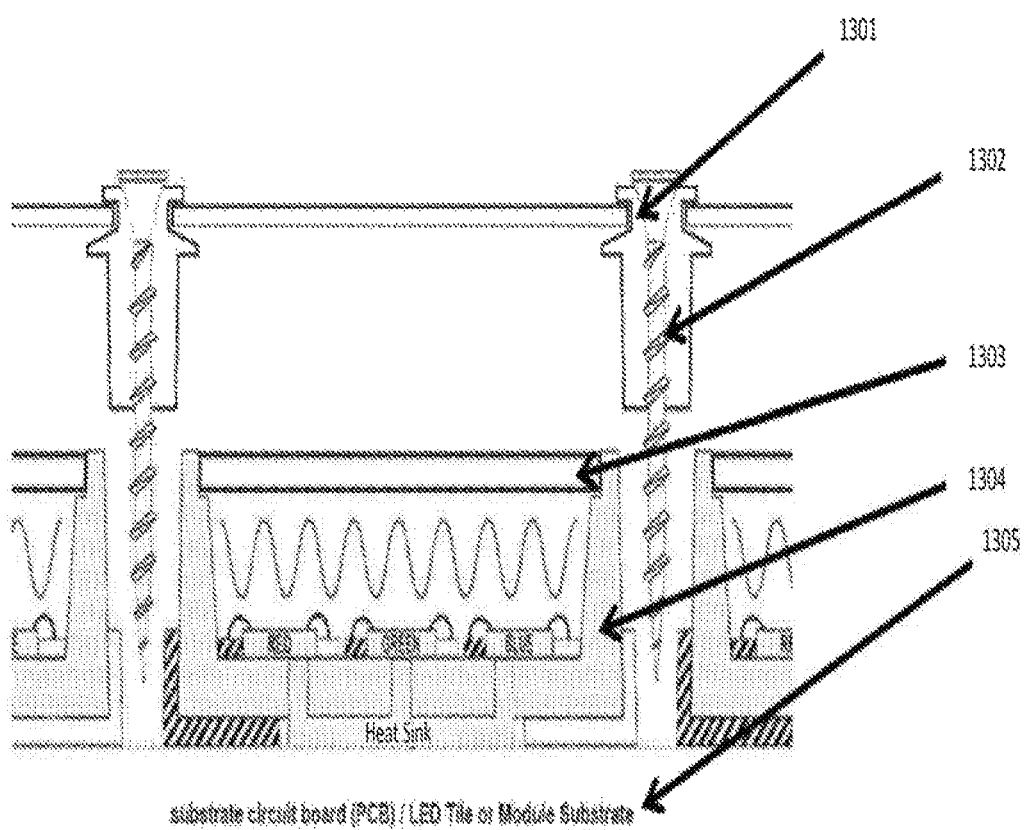
FIG. 13 is a cross section of an SMD LED housing and the protective covering shown in FIG. 12.

FIG. 13 is a cross section of an SMD LED housing 1304 with the protective covering 1203 shown in FIG. 12. From FIG. 13, the protective covering aligns above the SMD LED housing 1304. FIG. 13 shows the polarizer filter material registered and held in place using a notch 1301 as part of the protective covering and shows the screws, such as screw 1302, that affix the protective covering to substrate 1305. In this assembly, polarizer material 1301 does not form part of the SMD LED housing 1304. The polarizer material is part of the protective cover affixed above the SMD LED housing 1304 and SMD LED lens 1303.

Figure 14:
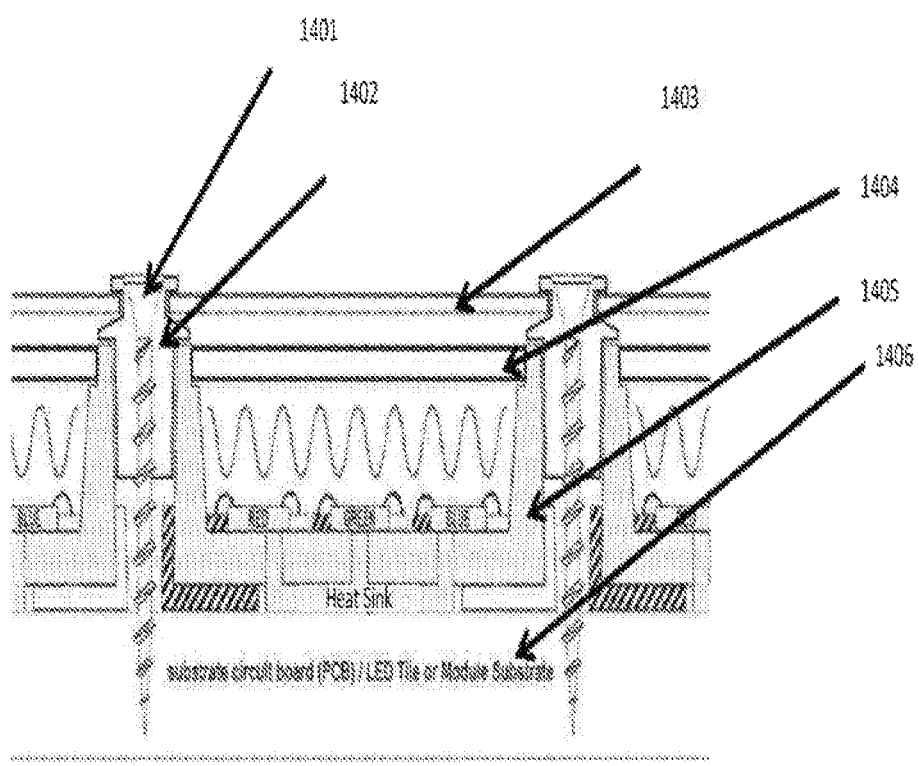
FIG. 14 represents the protective covering tightly and accurately fixed around and atop the SMD LED housing.

FIG. 14 represents the protective covering 1402 tightly and accurately fixed around and atop the SMD LED housing 1405, held in place by screws, clips, or pins such as screw 1401 in the substrate or circuit board 1406 so that the polarizer(s) 1403 is directly above each lens, such as lens 1404, of each individual SMD LED.

Figure 15:
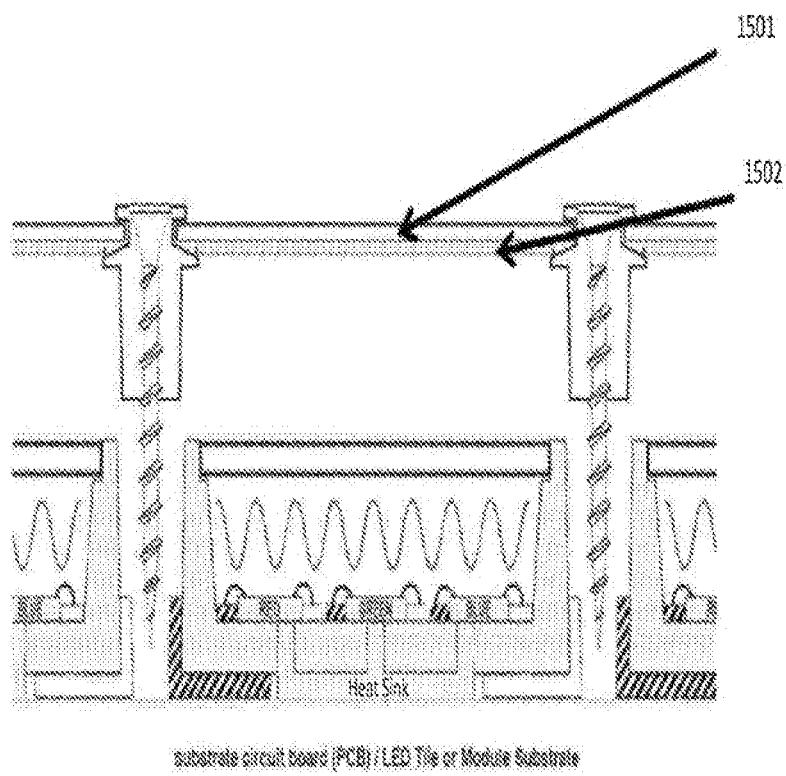
FIG. 15 shows diffuser material as a part of the protective covering and polarizer.
Figure 16:
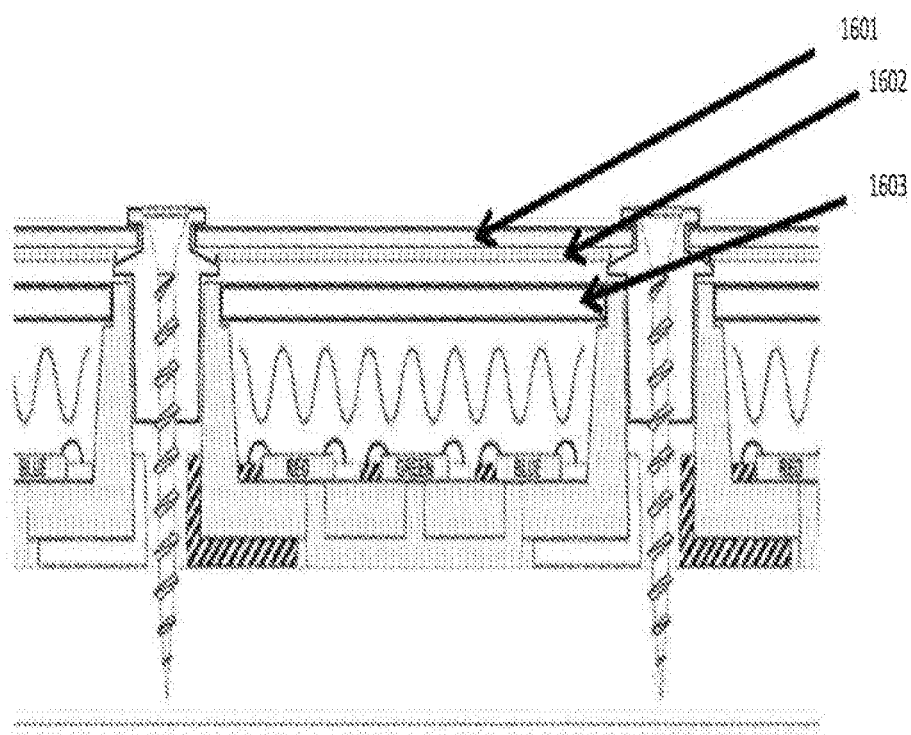
FIG. 16 illustrates the protective covering holding and securing the diffuser above the SMD LED lens and beneath the polarizer.

FIG. 15 shows diffuser material 1502 with the protective covering and polarizer, beneath polarizing material 1501, while FIG. 16 shows the protective covering holding and securing the diffuser 1602 above the SMD LED lens 1603 and beneath the polarizer 1601, where polarizer 1601 comprises filters or lenses as discussed herein.

Figure 17:
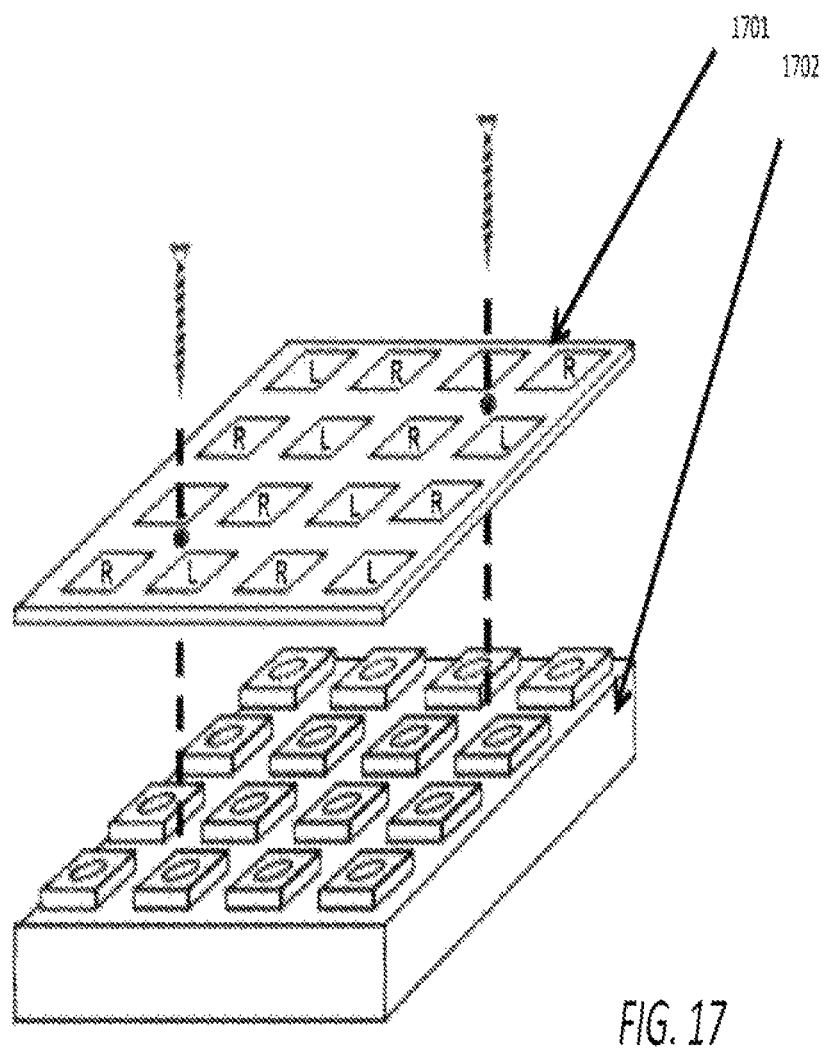
FIG. 17 illustrates the polarizing protective covering with a precise pattern of polarizers assembled inside the covering and aligned with and affixed to the LED tile or module using screws or pins.

FIG. 17 illustrates the polarizing protective covering 1701 with a precise pattern of polarizers assembled inside the covering and aligned with and affixed to the LED tile or module 1702 using screws or pins.

Figure 18:
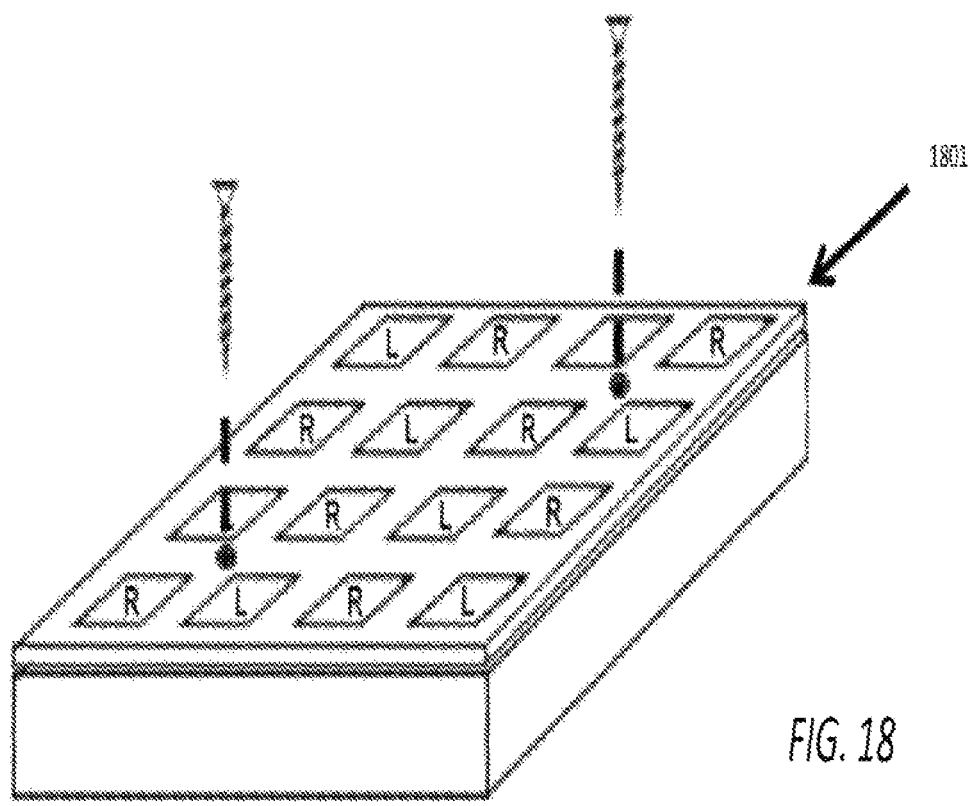
FIG. 18 shows the result of the combination of polarized cover and the LED module or tile.
Figure 19:
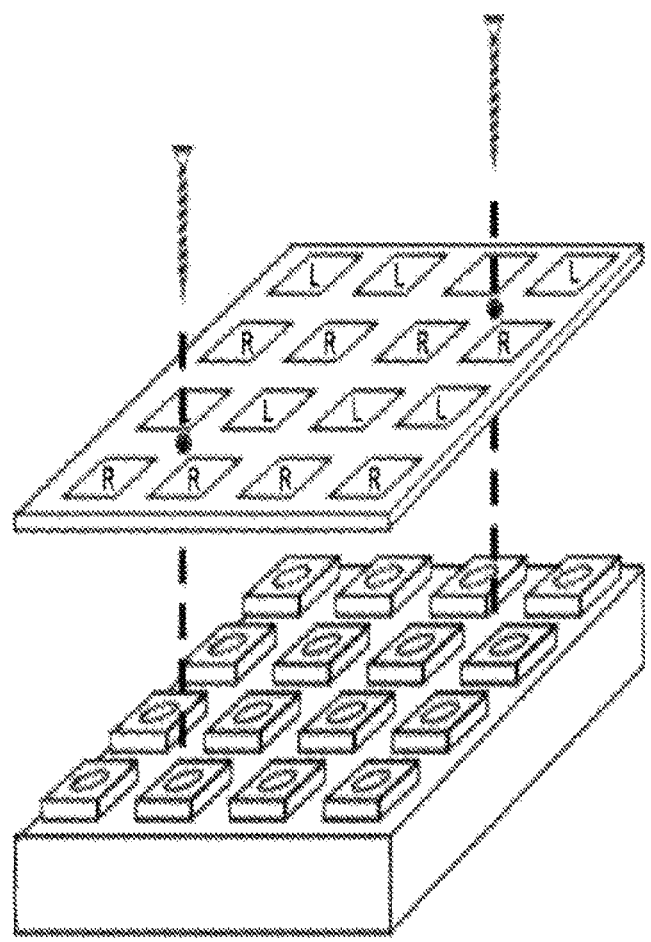
FIG. 19 illustrates the polarizing protective covering with a precise pattern of polarizers assembled inside the covering and aligned with and affixed to the LED tile or module using screws or pins in a linear pattern of alternating horizontal rows of left and right polarizers.
Figure 20:
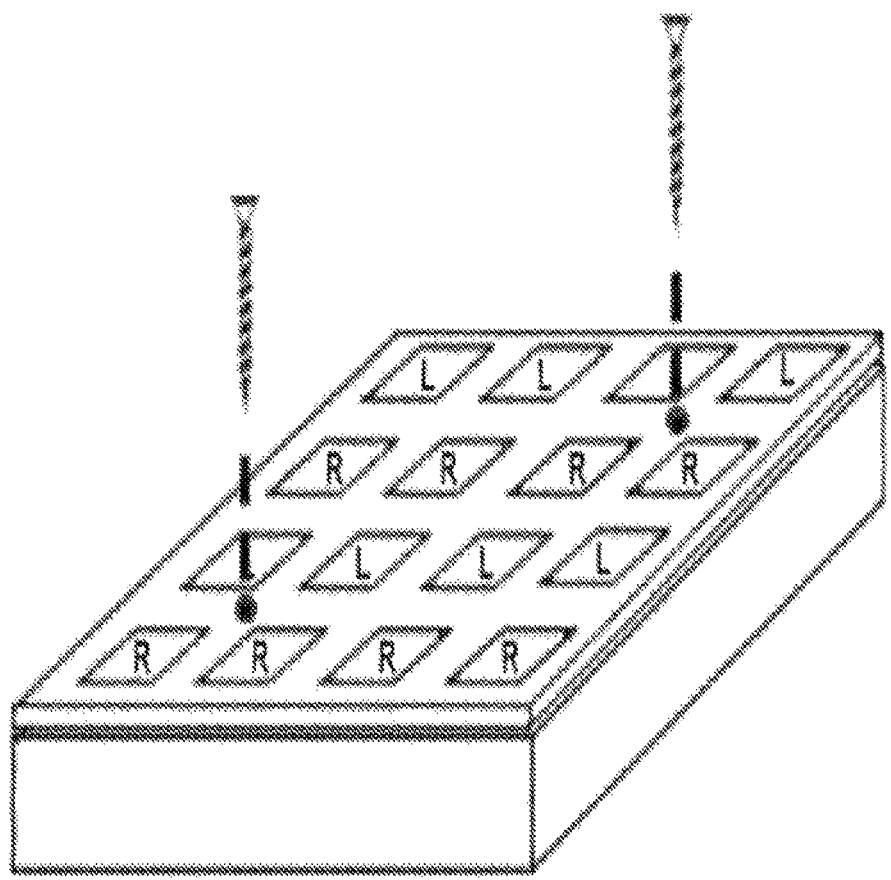
FIG. 20 shows the combination of the polarized cover and the LED module or tile with a linear pattern of alternating horizontal rows of left and right polarizers.

FIG. 18 shows the result of the combination of polarized cover and the LED module or tile 1801. Combining the polarized cover and the LED module or tile produces a 3D LED module or tile 1801, with the polarizers in the checkerboard pattern of alternating diagonal rows of left and right polarizers. FIGS. 19 and 20 are similar to FIGS. 17 and 18 but with a different polarizing pattern alignment. FIGS. 19 and 20 show the polarizer in the linear pattern of alternating horizontal rows of left and right polarizers.

Thus according to the present design, there is provided a stereoscopic display system, comprising an array of Light Emitting Diodes (LEDs) comprising a plurality of left LEDs, each left LED comprising left side electrical connections associated with a left housing, a left light transmitter arrangement within the left housing, and a left polarizing element positioned with the left housing above the left light transmitter arrangement, and a plurality of right LEDs, each right LED comprising right side electrical connections associated with a right housing, a right light transmitter arrangement within the right housing, and a right polarizing element positioned with the right housing and above the right light transmitter arrangement. At least one left housing and left polarizing element pair are each irregularly formed and fit together, and at least one right housing and right polarizing element are each irregularly formed in a manner complementary to the at least one left housing and left polarizing element.

Additionally, the present design may include the foregoing wherein at least one left LED comprises a left diffuser material positioned between the left polarizing element and the left light transmitter arrangement, and at least one right LED comprises a right diffuser material positioned between the right polarizing element and the right light transmitter arrangement. The plurality of left LEDs may be linearly arranged in a plurality of rows of left LEDs with a plurality of rows of right LEDs interspersed between the rows of left LEDs or the plurality of left LEDs and the plurality of right LEDs may be arranged in a checkerboard pattern. Further, at least one left polarizing element may be joined to at least one left housing using a bonding material.

At least one left polarizing element may be abraded and at least one right polarizing element may be abraded. The at least one left housing and left polarizing element pair may fit together and are each irregularly formed using one from the group consisting of a key mark, a slot, and a cut-out. In one arrangement, the at least one left housing comprises a left slot in one corner and the left polarizing element comprises an opening fitting with the left slot in the one corner, and at least one right housing comprises a right slot in a different corner. Circularly or linearly polarized light may be transmitted.

Alternately, the present design may include a stereoscopic display system comprising an array of Light Emitting Diodes (LEDs) comprising a plurality of left LEDs, each left LED comprising a left housing, a left light transmitter arrangement within the left housing, and a left polarizing element positioned with the left housing above the left light transmitter arrangement and a plurality of right LEDs, each right LED comprising a right housing, a right light transmitter arrangement within the right housing, and a right polarizing element positioned with the right housing and above the right light transmitter arrangement. At least one left housing and left polarizing element pair are each irregularly formed and fit together, and at least one right housing and right polarizing element are each irregularly formed in a manner complementary to the at least one left housing and left polarizing element.

In another embodiment, an apparatus for placing a Light Emitting Diodes (LEDs) in an arrangement is provided, comprising a carrier tape and a plurality of LEDs positioned on the carrier tape, each LED comprising a housing, a light transmitter arrangement within the housing, and a polarizing element positioned with the housing above the light transmitter arrangement. Each housing comprises a specific directional feature representing a polarization direction and each polarizing element includes a complementary specific directional feature configured to fit with one corresponding housing.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something designated from the group consisting of A, B, C . . . and N, the text should be interpreted as requiring only one element from the group, not A plus N, or B plus N, etc.

What is claimed is:

1. A method of manufacturing a stereoscopic display system having a matrix of first and second differently polarized light emitting housings, comprising;
    providing each of the housings of the first set with a first polarizing element disposed above a first light transmission element;
    wherein the housings of the first set are individually addressable, and each is a unitary material body which inlcueds a cavity within which is disposed the first light emitting element and the first polarizing element;
    wherein within each cavity of the housings of the first set (1) the first polarizing element is bonded to the first light transmission element, and (2) a wall of the housing is disposed lateral to the first polarizing element;
    providing each of the housings of the second set with a second polarizing element disposed above a second light transmission element, wherein the first polarizing elements polarize light in a different direction from the second polarizing elements;
    wherein the housings of the second set are individually addressable, and each is a unitary material body which includes a cavity within which is disposed the second light emitting element and the second polarizing element; and
    wherein within each cavity of the housings of the second set (1) the second polarizing element is bonded to the second light transmission element, and (2) a wall of the housing is disposed lateral to the second polarizing element;
    positioning the first and second sets of polarizing light emitting housings in the matrix such that when the matrix is viewed through glasses with corresponding polarizing lenses, a viewer perceives an image displayed by the matrix as a three dimensional.

2. The method of claim 1, wherein at least one of the housings of the first set includes a third polarizing element disposed above a third light transmission element.

3. The method of claim 2, wherein the first light transmission elements transmit a first color, and the third light transmission elements transmit another color different from the first color.

4. The method of claim 1, wherein at least one of the housings of the first set includes a third polarizing element disposed above a third light transmission element, and a fourth polarizing element disposed above a fourth light transmission element.

5. The method of claim 4, wherein the first, third and fourth light transmission elements emit red light, green light, and blue light, respectively.

6. The method of claim 1, further comprising bonding a diffuser between at least one of the first light transmission elements and least one of the first polarizing elements.

7. The method of claim 1, further comprising providing at least one of the first polarizing elements with a downward facing abraded surface.

8. The method of claim 1 wherein the matrix is a checkerboard pattern.

9. The method of claim 1 wherein the matrix comprises rows of the first set of housings alternating with rows of the second set of housings.

10. The method of claim 1, wherein the step of providing at least some of the housings of the first and second sets of polarizing light emitting housings with visually distinguishable markings.

11. The method of claim 10, further comprising using the visually distinguishable markings to aid in placement of at least some of the housings within the matrix.

12. The method of claim 1, further comprising removing members of the first set of polarizing light emitting housings from a first carrier tape, and removing members of the second set of polarizing light emitting housings from a second carrier tape, different from the first carrier tape.

13. The method of claim 1, wherein the step of positioning comprises choosing members of both the first and second sets of polarizing light emitting housings from a single carrier tape.

14. The method of claim 1, wherein different ones of the first light transmission elements are different RGBY semi-conductors.

15. The method of claim 1, wherein different ones of the first light transmission elements are different RGBW semi-conductors.

16. The method of claim 1, wherein at least one of the first light transmission elements is an infrared emitting semi-conductor.

17. The method of claim 1, wherein at least one of the first light transmission elements is a quantum dot semi-conductor.

* * * * *

UNITED STATES PATENT AND TRADEMARK OFFICE
CERTIFICATE OF CORRECTION

| | |
|---|---|
| PATENT NO. | : 11,327,334 B2 |
| APPLICATION NO. | : 16/404606 |
| DATED | : May 10, 2022 |
| INVENTOR(S) | : Nathaniel Huber |

It is certified that error appears in the above-identified patent and that said Letters Patent is hereby corrected as shown below:

In the Claims

At Column 14, Lines 17 to 18, change, "material body which inclueds a cavity" to --material body which includes a cavity--

Signed and Sealed this
Sixth Day of September, 2022

Katherine Kelly Vidal
*Director of the United States Patent and Trademark Office*